(12) United States Patent
Moriwaki (10) Patent No.: US 7,570,311 B2
(45) Date of Patent: Aug. 4, 2009

(54) ELECTRO-OPTICAL DEVICE, ELECTRONIC APPARATUS, AND METHOD OF MANUFACTURING ELECTRO-OPTICAL DEVICE HAVING PARTICULAR CAPACITIVE ELEMENTS

(75) Inventor: Minoru Moriwaki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 555 days.

(21) Appl. No.: 11/426,716

(22) Filed: Jun. 27, 2006

(65) Prior Publication Data
US 2007/0029613 A1   Feb. 8, 2007

(30) Foreign Application Priority Data
Aug. 5, 2005   (JP) .............................. 2005-227572

(51) Int. Cl.
G02F 1/1343   (2006.01)
(52) U.S. Cl. ......................................... 349/38; 349/39
(58) Field of Classification Search ................... 349/38, 349/39
See application file for complete search history.

(56) References Cited

U.S. PATENT DOCUMENTS 5,183,775 A * 2/1993 Levy ........................... 438/386
2007/0182874 A1* 8/2007 Kamijima ..................... 349/44

FOREIGN PATENT DOCUMENTS

JP          2004191930 A  *  7/2004
JP       A 2004-191930       7/2004

* cited by examiner

*Primary Examiner*—Mike Qi
(74) *Attorney, Agent, or Firm*—Oliff & Berridge, PLC (57) ABSTRACT

An electro-optical device includes: an electro-optical device substrate; step portions having a concave shape that are formed on a predetermined insulating film of the electro-optical device substrate; side wall portions each of which is formed on a side surface of the concave step portion between the surface of the insulating layer and the bottom of the step portion and has an upward convex curved surface, the surface of the curved surface being continuously formed with the surface of the insulating film at the top of the concave step portion; and capacitive elements each of which is formed on the step portion and the side wall portion and has a lower electrode layer, an upper electrode layer, and a dielectric layer interposed between the lower electrode layer and the upper electrode layer.

10 Claims, 8 Drawing Sheets

ELECTRO-OPTICAL DEVICE, ELECTRONIC APPARATUS, AND METHOD OF MANUFACTURING ELECTRO-OPTICAL DEVICE HAVING PARTICULAR CAPACITIVE ELEMENTS

BACKGROUND

1. Technical Field

The present invention relates to an electro-optical device, an electronic apparatus, and a method of manufacturing an electro-optical device, and more particularly, to an electro-optical device including an electro-optical device substrate having capacitive elements, each composed of a pair of electrodes and an insulating film interposed therebetween, formed thereon, to an electronic apparatus, and to a method of manufacturing an electro-optical device.

2. Related Art

There has been known a liquid crystal device, which is an example of an electro-optical device, that includes pixel electrodes arranged in a matrix and thin film transistors (hereinafter, referred to as TFTs) connected to the pixel electrodes and is driven by an active matrix driving method. The liquid crystal device, which is an example of the electro-optical device, includes a TFT array substrate, a counter substrate arranged opposite to the TFT array substrate, the pixel electrodes formed on the TFT array substrate, a counter electrode formed on the counter substrate so as to be opposite to the pixel electrodes, a liquid crystal layer interposed between the pixel electrodes and the counter electrode, and capacitive elements connected to the pixel electrodes and the TFTs. The arrangement of liquid crystal molecules in the liquid crystal layer is changed according to a potential applied between the pixel electrodes and the counter electrode, which causes transmittance of light passing through the liquid crystal layer to vary, thereby displaying an image.

In this case, the capacitive elements connected to the TFTs function to improve the potential holding characteristic of the pixel electrodes.

The substrate of the electro-optical device includes an image display region having scanning lines, data lines, the pixel electrodes, and storage capacitors, which are the capacitive elements, provided therein, a scanning line driving circuit, and a data line driving circuit. An electro-optical device disclosed in JP-A-2004-191930 can be considered as a typical example of the above-mentioned electro-optical device.

The storage capacitor, which is the capacitive element, includes a lower electrode electrically connected to the TFT and the pixel electrode, a capacitor electrode arranged opposite to the lower electrode, and a dielectric film arranged between the lower electrode and the capacitor electrode. It is necessary to increase the capacitance of the capacitive element in order to improve the display quality of the electro-optical device. In recent years, a method of reducing the thickness of the dielectric film of the capacitive element has been used. In addition, in order to increase the capacitance of the capacitive element, for example, a method of three-dimensionally forming the capacitive element to increase the area of the capacitive element, such as a method of forming the capacitive element in a contact hole, has been used.

However, when the thickness of the dielectric film decreases and the capacitive element is three-dimensionally formed to improve the display quality of the electro-optical device, an electric field may concentrate on a portion in which a side surface and an upper surface of a step portion, such as an aperture of the contact hole, intersects each other, that is, on the lower electrode formed on an angular portion. Therefore, in the conventional electro-optical device having the above-mentioned structure, a short circuit may occur between the lower electrode and the capacitor electrode of the capacitive element. When the shirt circuit between the electrodes of the capacitive element occurs in a pixel, the pixel causes a constant potential to be always applied to the liquid crystal layer. Thus, the related art has a problem in that the manufacturing yield of the electro-optical device is lowered.

SUMMARY

An advantage of some aspects of the invention is that it provides an electro-optical device capable of preventing a short circuit between opposing electrodes of a capacitive element when the capacitive element is three-dimensionally formed in a region including a step portion, an electronic apparatus, and a method of manufacturing an electro-optical device.

According to an aspect of the invention, an electro-optical device includes an electro-optical device substrate; step portions having a concave shape that are formed on a predetermined insulating film of the electro-optical device substrate; side wall portions each of which is formed on a side surface of the concave step portion between the surface of the insulating layer and the bottom of the step portion and has an upward convex curved surface, the surface of the curved surface being continuously formed with the surface of the insulating film at the top of the concave step portion; and capacitive elements each of which is formed on the step portion and the side wall portion and has a lower electrode layer, an upper electrode layer, and a dielectric layer interposed between the lower electrode layer and the upper electrode layer.

According to another aspect of the invention, an electro-optical device includes: an electro-optical device substrate; step portions having a convex shape that are formed on a predetermined insulating film of the electro-optical device substrate; side wall portions each of which is formed on a side surface of the convex step portion between the surface of the insulating layer and an upper surface of the step portion and has an upward convex curved surface, the surface of the curved surface being continuously formed with the upper surface of the convex step portion at the top of the side wall portion; and capacitive elements each of which is formed on the step portion and the side wall portion and has a lower electrode layer, an upper electrode layer, and a dielectric layer interposed between the lower electrode layer and the upper electrode layer.

According to still another aspect of the invention, there is provided a method of manufacturing an electro-optical device having capacitive elements formed on a substrate. The method includes: forming step portions having a concave or convex shape on a predetermined insulating layer; forming a film to be etched on a side surface of each of the step portions; performing anisotropic etching on the surface of the film to be etched; and forming, on a region including the step portion, a portion of the capacitive element having a lower electrode layer, an upper electrode layer, and a dielectric layer interposed between the lower electrode layer and the upper electrode layer.

According to yet another aspect of the invention, there is provided a method of manufacturing an electro-optical device having capacitive elements formed on a substrate. The method includes: forming step portions having a concave or convex shape on a predetermined insulating layer; forming a film to be etched on a side surface of each of the step portions; performing etching including isotropic etching and anisotropic etching on the surface of the film to be etched; and forming, on a region including the step portion, a portion of the capacitive element having a lower electrode layer, an upper electrode layer, and a dielectric layer interposed between the lower electrode layer and the upper electrode layer.

According to the above-mentioned aspects, it is possible to obtain reliability of the thicknesses of the dielectric layer, the lower electrode, and the upper electrode of the capacitive element formed on the upper surface of a portion in which the upper surface and side surface of the step portion having a concave or convex shape intersects each other. That is, it is possible to stably form the dielectric layer of the capacitive element formed on the step portion with a small thickness, and to form the capacitive element not having a short circuit between electrodes thereof, while increasing the capacitance of the capacitive element.

In the electro-optical device according to the above-mentioned aspect, preferably, in a cross-sectional view of a plane that is orthogonal to the surface of the insulating layer and includes a normal line with respect to the side surface, a tangent line of the surface of the side wall portion is substantially parallel to a tangent line of the surface of the insulating film, at the top of the side wall portion of the concave step portion, and the inclination of the tangent line of the surface of the side wall portion with respect to the surface of the insulating film continuously increases toward a lower side. According to this structure, it is possible to form a continuous curved surface of the lower electrode of the capacitive element that is formed on a portion in which the upper surface and the side surface of the concave step portion intersects each other. Therefore, it is possible to prevent an electric field from concentrating on a portion of the lower electrode of the capacitive element that is formed on a region including the concave step portion and thus to prevent a short circuit between electrodes of the capacitive element.

In the electro-optical device according to the above-mentioned aspect, preferably, in a cross-sectional view of a plane that is orthogonal to the surface of the insulating layer and includes a normal line with respect to the side surface, a tangent line of the surface of the side wall portion is substantially parallel to a tangent line of the upper surface of the convex step portion, at the top of the side wall portion, and the inclination of the tangent line of the surface of the side wall portion with respect to the surface of the insulating film continuously increases toward a lower side.

According to this structure, it is possible to form a continuous curved surface of the lower electrode of the capacitive element that is formed on a portion in which the upper surface and the side surface of the convex step portion intersects each other. Therefore, it is possible to prevent an electric field from concentrating on a portion of the lower electrode of the capacitive element that is formed on a region including the convex step portion and thus to prevent a short circuit between electrodes of the capacitive element.

In the electro-optical device according to the above-mentioned aspect, it is preferable that the concave step portions are contact holes formed in the insulating film.

In the electro-optical device according to the above-mentioned aspect, it is preferable that the side wall portion be composed of a plasma TEOS film, a low pressure TEOS film, or a BPSG film.

In the electro-optical device according to the above-mentioned aspect, it is preferable that the side wall portion be composed of a metal film.

According to this structure, it is possible to improve the shielding performance of the step portion having a portion of the capacitive element formed therein, and thus to display a high-quality image.

According to still yet another aspect of the invention, an electronic apparatus includes the above-mentioned electro-optical device.

According to this structure, it is possible to provide an electronic apparatus including an electro-optical device capable of preventing a short circuit between electrodes of a capacitive element, and thus to display a high-quality image without display defects.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Hereinafter, preferred embodiments of the invention will be described with reference to the accompanying drawings. In the following embodiments, an electro-optical device of the invention is applied to a liquid crystal display device.

Overall Structure of Liquid Crystal Display Device

Figure 1:
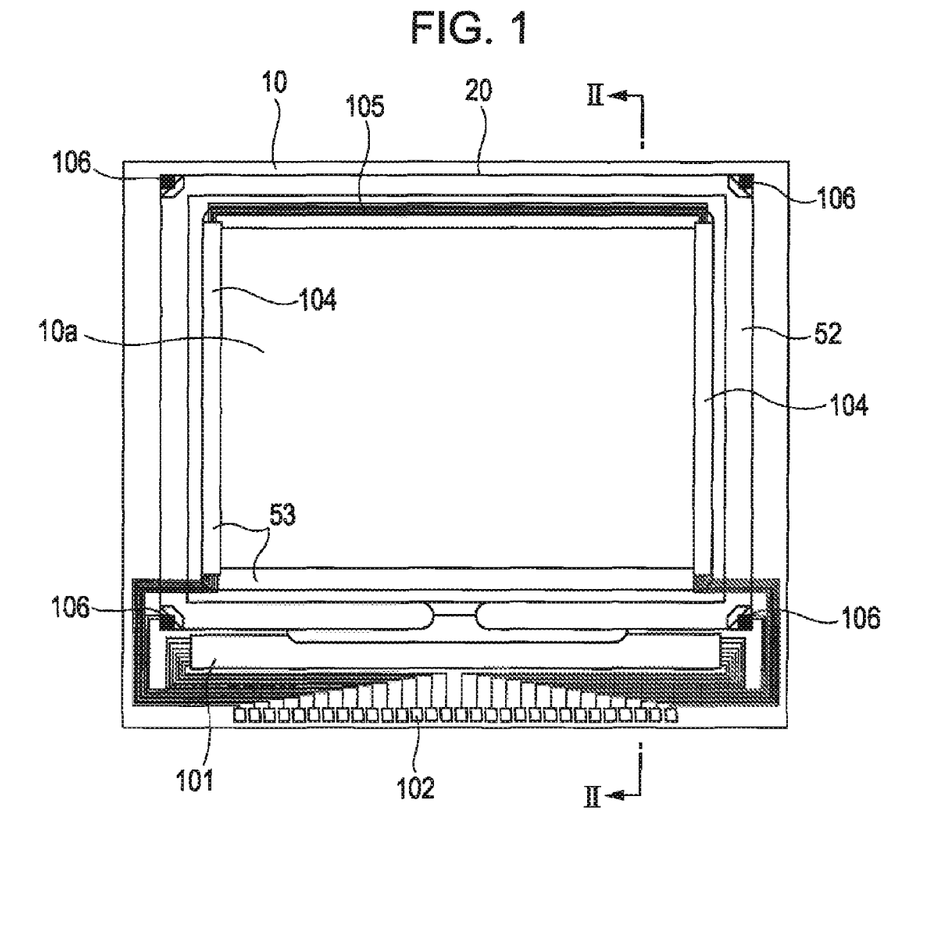
FIG. 1 is a plan view illustrating the overall structure of an electro-optical device according to an embodiment of the invention.
Figure 2:
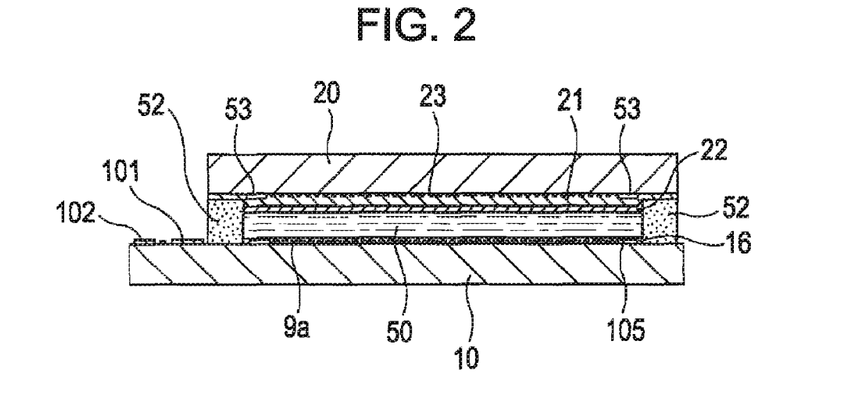
FIG. 2 is a cross-sectional view taken along the line II-II of FIG. 1.

The overall structure of an electro-optical device according to an embodiment of the invention will be described with reference to FIGS. 1 and 2. FIG. 1 is a plan view illustrating a TFT array substrate and various components formed on the TFT array substrate of the electro-optical device, as viewed from a counter substrate, and FIG. 2 is a cross-sectional view taken along the line II-II of FIG. 1. In the following description, a liquid crystal display device that has driving circuits integrated thereinto and is driven by a TFT active matrix driving method is exemplified as an example of the electro-optical device.

In FIGS. 1 and 2, the electro-optical device according to this embodiment includes a TFT array substrate 10 and a counter substrate 20 that is opposite to the TFT array substrate 10. A liquid crystal layer 50 is interposed between the TFT array substrate 10 and the counter substrate 20, and the TFT array substrate 10 and the counter substrate 20 are bonded to each other by a sealing material 52 that is provided in a sealing region located around the periphery of an image display region 10a.

The sealing material 52 is made of for example, an ultraviolet-curable resin or a thermally curable resin, to bond the substrates. In a manufacturing process, the sealing material 52 is applied onto the TFT array substrate 10 and is then hardened by radiation with ultraviolet rays or by heating. In addition, gap members, such as glass fibers or glass beads, are dispersed in the sealing material 52 to maintain a gap between the TFT array substrate 10 and the counter substrate 20 at a predetermined value. When the liquid crystal device is used for, for example, a liquid crystal display or a liquid crystal television that displays a large image at the same magnification, the gap members may be contained in the liquid crystal layer 50.

A frame-shaped light-shielding film 53 for defining a frame region of the image display region 10a is formed around an inner circumference of the sealing region having the sealing material 52 arranged therein on the counter substrate 20. Alternatively, a portion of or the entire frame-shaped light-shielding film 53 may be provided on the TFT array substrate 10 as an integrated light-shielding film.

A data line driving circuit 101 and external circuit connecting terminals 102 are provided along one side of the TFT array substrate 10 outside the sealing region in which the sealing material 52 is arranged. Scanning line driving circuits 104 are provided along two sides of the TFT array substrate 10 adjacent to the one side so as to be covered with the frame-shaped light-shielding film 53. In addition, a plurality of wiring lines 105 for connecting the scanning line driving circuits 104 arranged at both sides of the image display region 10a are provided along the remaining one side of the TFT array substrate 10 so as to be covered with the frame-shaped light-shielding film 53.

Further, vertical connection members 106 are provided at four corners of the counter substrate 20 to connect the TFT array substrate 10 and the counter substrate 20. In addition, vertical connection terminals are provided in regions on the TFT array substrate 10 corresponding to these four corners. The TFT array substrate 10 and the counter substrate 20 are electrically connected to each other by the vertical connection members 106 and the vertical connection terminals.

In FIG. 2, on the TFT array substrate 10, pixel electrodes 9a are formed on pixel switching TFTs and various wiring lines, such as scanning lines and data lines, and an alignment film 16 is formed on the pixel electrodes 9a. On the other hand, a counter electrode 21 and a lattice-shaped or strip-shaped light-shielding film 23 are formed on the counter substrate 20, and an alignment film 22 is formed on an uppermost layer of the counter substrate 20. The liquid crystal layer 50 is composed of one kind of nematic liquid crystal or liquid crystal obtained by mixing several kinds of nematic liquid crystal, and the liquid crystal is arranged between the two alignment films in a predetermined alignment state.

The TFT array substrate 10 shown in FIGS. 1 and 2 may be provided with, for example, a sampling circuit that samples image signals on image signal lines and supplies the sampled image signals to data lines, a pre-charge circuit that supplies pre-charge signals having a predetermined voltage level to a plurality of data lines prior to the image signals, and a test circuit that evaluates the quality and testes defects of the electro-optical device during manufacturing or prior to shipping, in addition to the data line driving circuit 101 and the scanning line driving circuits 104.

Structure of Pixel

Figure 3:
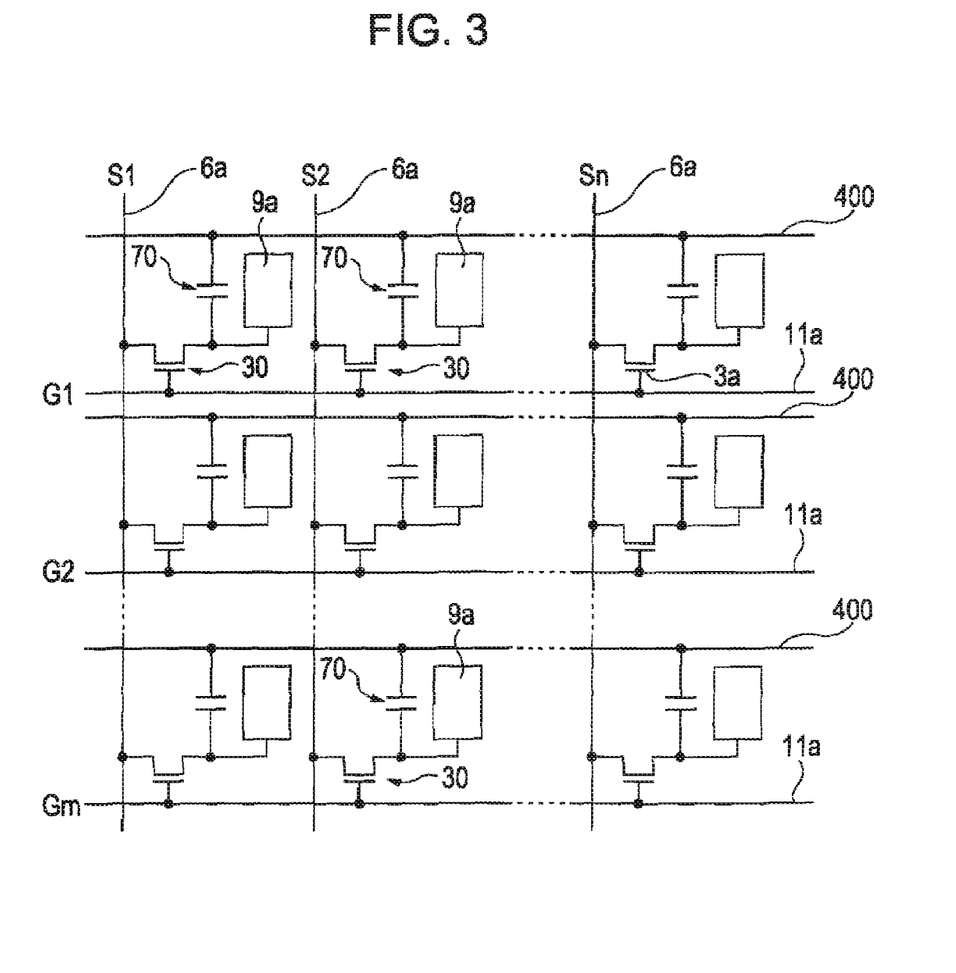
FIG. 3 is an equivalent circuit diagram of various elements and wiring lines of a plurality of pixels arranged in a matrix in an image display region of the electro-optical device.
Figure 4:
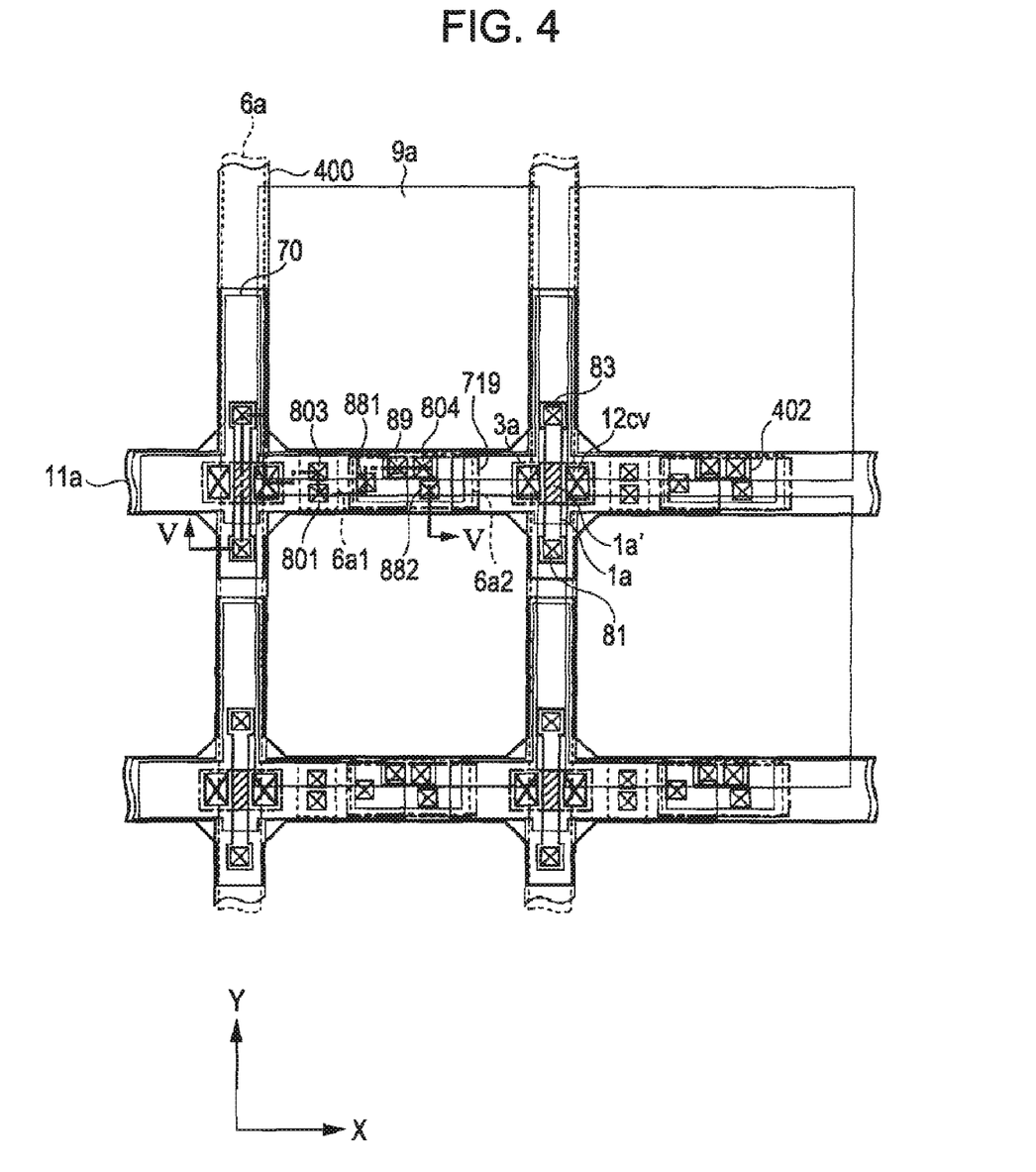
FIG. 4 is a plan view illustrating a plurality of pixel groups adjacent to each other on a TFT array substrate having data lines, scanning lines and pixel electrodes formed thereon.
Figure 5:
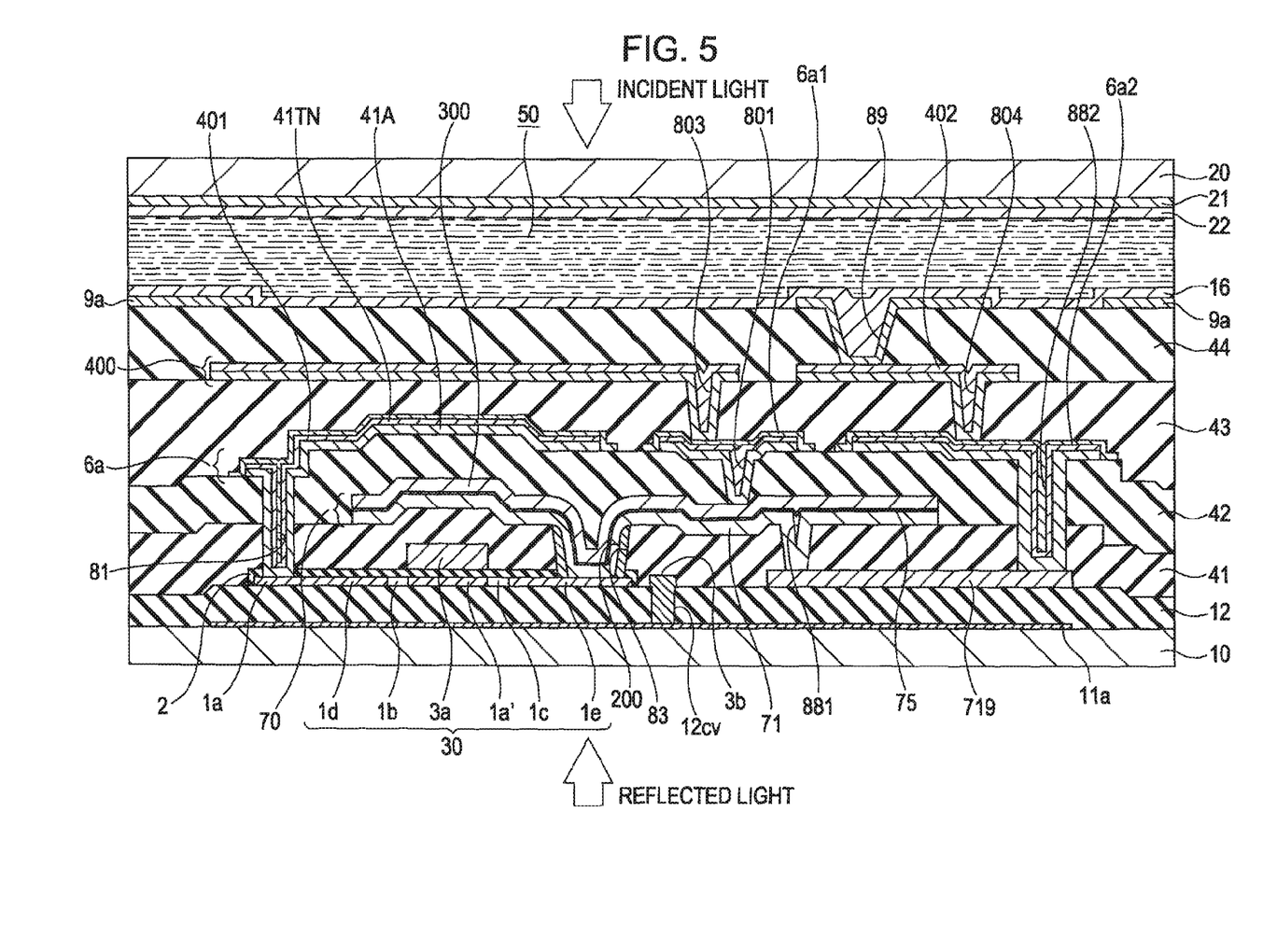
FIG. 5 is a cross-sectional view taken long the line V-V of FIG. 4.

The structure of the pixel of the electro-optical device according to this embodiment of the invention will be described below with reference to FIGS. 3, 4, and 5. FIG. 3 is an equivalent circuit diagram of various elements and wiring lines of a plurality of pixels that are arranged in a matrix in the image display region of the electro-optical device. FIG. 4 is a plan view illustrating a plurality of pixel groups adjacent to each other on the TFT array substrate having, for example, the data lines, the scanning lines, and the pixel electrodes formed thereon. FIG. 5 is a cross-sectional view taken along the line V-V of FIG. 4. In FIG. 5, the scale of each member and layer is adjusted so as to have a recognizable size.

Circuit Structure of Pixel

In FIG. 3, a plurality of pixels are formed in a matrix in the image display region of the electro-optical device according to this embodiment, and each of the pixels is provided with the pixel electrode 9a and a TFT 30 for controlling the switching of the pixel electrode 9a, and a data line 6a through which the image signals are supplied is electrically connected to a source of the TFT 30. Image signals S1, S2, ..., Sn may be supplied in this order to the data lines 6a in a line sequential manner, or they may be supplied to each group of adjacent data lines 6a.

Further, in each pixel, a gate electrode 3a is electrically connected to a gate of the TFT 30, and at a predetermined timing, scanning signals G1, G2, ..., Gm are line-sequentially supplied to the scanning lines 11a and the gate electrodes 3a in this order in a pulse manner. Each pixel electrode 9a is electrically connected to a drain of the TFT 30. When the TFTs 30, that is, switching elements are maintained in an on state during a predetermined period of time, the image signals S1, S2, ..., Sn supplied from the data lines 6a are selected at a predetermined timing and are ten written onto the pixels through the scanning lines 11a.

The image signals S1, S2, ..., Sn that are written onto the pixels at a predetermined level are held between the pixel electrodes 9a and the counter electrode formed on the counter substrate for a predetermined period of time. The alignment or order of liquid crystal molecules varies depending on the level of a voltage applied, which makes it possible to modulate light and to perform gray-scale display. In a normally white mode, the transmittance of incident light decreases in accordance with the voltage applied to each pixel. In a normally black mode, the transmittance of incident light increases in accordance with a voltage applied to each pixel. Therefore, light having a contrast corresponding to the image signals is emitted from the electro-optical device.

In order to prevent the image signal held between the pixel electrode and the counter electrode from leaking, a capacitive element 70 is provided in parallel to a liquid crystal capacitor formed between the pixel electrode 9a and the opposing electrode. The capacitive element 70 is provided in parallel to the scanning line 11a, and a fixed-potential-side capacitor electrode is connected to a capacitor line 400 fixed at a predetermined potential.

Detailed Structure of Pixel

The detailed structure of the electro-optical device that includes the data lines 6a, the scanning lines 11a, the gate electrodes 3a, and the TFTs 30 and performs the above-described circuit operation will be described below with reference to FIGS. 3 to 5.

As shown in FIGS. 3 and 4, a plurality of pixel electrodes 9a are provided in a matrix on the TFT array substrate 10, and the data lines 6a and the scanning lines 11a are provided along horizontal and vertical boundaries of the pixel electrodes 9a. The data line 6a is formed in a laminated structure including an aluminum film, which will be described later, and the scanning line 11a is formed of, for example, a conductive polysilicon film. At intersections of the scanning lines 11a and the data lines 6a in plan view, the TFTs 30 each having a semiconductor layer 1a and the gate electrode 3a are provided between the scanning lines 11a and the data lines 6a. As shown in FIG. 4, the scanning line 11a is opposite to the gate electrode 30, with a channel region 1a' of the semiconductor layer 1a that is represented by a hatched region in which parallel hatch lines are inclined toward its upper right corner interposed therebetween, and the scanning line 11a is electrically connected to the gate electrode 30a by a common contact hole 12cv.

As shown in FIG. 5, the electro-optical device includes the TFT array substrate 10 formed of, for example, a quartz substrate, a glass substrate, or a silicon substrate, and the counter substrate 20 that is arranged opposite to the TFT array substrate 10 and is formed of, for example, a glass substrate or a quartz substrate.

As shown in FIG. 5, the pixel electrodes 9a are provided on the TFT array substrate 10, and the alignment film 16 on which a predetermined alignment process, such as a rubbing process, has been performed is provided on the pixel electrodes 9a. The pixel electrode 9a is composed of a transparent conductive film, such as an ITO film. The counter electrode 21 is provided on the entire surface of the counter substrate 20, and the alignment film 22 on which a predetermined alignment process, such as a rubbing process, has been performed is provided on the counter electrode 21. the counter electrode 21 is composed of a transparent conductive film, such as an ITO film, similar to the pixel electrodes 9a.

An electro-optical material, such as liquid crystal, is injected in a space surrounded by the sealing member 52 (see FIGS. 1 and 2) between the TFT array substrate 10 and the counter substrate 20 that are opposite to each other, thereby forming the liquid crystal layer 50. The liquid crystal layer 50 is kept in a predetermined alignment state by the alignment films 16 and 22 when no electric field is applied from the pixel electrodes 9a.

Further, a laminated structure of components other than the pixel electrodes 9a and the alignment film 16 is provided on the TFT array substrate 10. As shown in FIG. 5, the laminated structure includes, from the bottom, a first layer having the scanning lines 11a, a second layer having, for example, the gate electrodes 3a of the TFTs 30, a third layer having the capacitive elements 70, a fourth layer having, for example, the data lines 6a, a fifth layer having, for example, the capacitor lines 400, and a sixth layer uppermost layer) having, for example, the pixel electrodes 9a and the alignment film 16. A base insulating film 12 is provided between the first layer and the second layer, and a first interlayer insulating film 41 is provided between the second layer and the third layer. A second interlayer insulating film 42 is provided between the third layer and the fourth layer, and a third interlayer insulating film 43 is provided between the fourth layer and the fifth layer. In addition, a fourth interlayer insulating film 44 is provided between the fifth layer and the sixth layer. These interlayer insulating films prevent electrical connection among the abovementioned components. Further, contact holes for electrically connecting heavily doped source regions 1d of the semiconductor layers 1a of the TFTs 30 to the data lines 6a are provided in the insulating films 12, 41, 42, 43, and 44. Next, the above-mentioned components will be sequentially described from the lower layer.

Laminated Structure: Structure of First Layer—Scanning Lines, etc.

First, the first layer is provided with the scanning lines 11a formed of, for example, a metallic material having a high melting point, such as Ti, Cr, W, Ta, or Mo, an alloy thereof, metal silicide, polysilicide, a laminated structure thereof, or conductive polysilicon. The scanning lines 11a are patterned in strip shapes extending in the X direction of FIG. 4 in plan view. More specifically, the strip-shaped scanning line 11a includes a main body portion extending in the x direction of FIG. 4 and a protruding portion extending in the Y direction of FIG. 4 in which the data line 6a or the capacitor line 400 extends. The protruding portions extending adjacent scanning lines 11a are not connected to each other, so that the scanning lines 11a are separated from one another.

Laminated Structure: Structure of Second Layer—TFTS, etc.

Next, the TFTs 30 including the gate electrodes 3a are provided in the second layer. As shown in FIG. 5, the TFT 30 has an LDD (lightly doped drain) structure. The TFT 30 includes the gate electrode 3a, the channel region 1a' of the semiconductor layer 1a which is formed of, for example, a polysilicon film and whose channel is formed by an electric field from the gate electrode 3a, an insulating film 2 that includes a gate insulating film for electrically insulating the semiconductor layer 1a from the gate electrode 3a, a lightly doped source region 1b and a lightly doped drain region 1c of the semiconductor layer 1a, and a heavily doped source region 1d and a heavily doped drain region 1e of the semiconductor layer 1a.

In this embodiment, a relay electrode 719 is formed in the second layer by using the same film as that used for the gate electrode 3a. As show in FIG. 4, the relay electrode 719 is formed in an island shape in plan view so as to be arranged below one side of the pixel electrode 9a extending in the X direction. In this embodiment, the relay electrode 719 and the gate electrode 3a are formed of the same film. That is, when the latter is composed of a conductive polysilicon film, the former is also composed of a conductive polysilicon film.

It is preferable that the TFT 30 have the LDD structure as shown in FIG. 5. Alternatively, the TFT 30 may have an offset structure in which no impurity is doped into the lightly doped source region 1b and the lightly doped drain region 1c, or it may have a self-alignment structure in which impurities are doped at high concentration using the gate electrode 3a as a mask to form a heavily doped source region and a heavily doped drain region in a self-alignment manner.

Laminated Structure: Structure between First and Second Layers—Base Insulating Film The base insulating film 12 composed of, for example, a silicon oxide film is provided between the above-mentioned scanning lines 11a and the TFTs 30. The base insulating film 12 has a function of insulating the TFTs 30 from the scanning lines 11a. Further, since the base insulating film 12 is formed on the entire surface of the TFT array substrate 10, it has a function of preventing a change in the characteristics of the pixel switching TFTs 30 due to roughness when the surface of the TFT array substrate 10 is polished or contaminants remaining after cleaning.

In the base insulating film 12, contact holes 12cv, each extending in the lengthwise direction of the channel of the semiconductor layer 1a which extends along the data line 6a, which will be described later, are formed at both sides of the semiconductor layer 1a in plan view. A side wall portion 3b, which is a portion of the gate electrode 3a, is formed in each of the contact holes 12cv, and the gate electrode 3a and the scanning line 11a are electrically connected to each other by the side wall portion 3b.

Laminated Structure: Structure of Third Layer—Capacitive Elements, etc.

The capacitive element 70 is provided in the third layer above the second layer. The capacitive element 70 is formed by arranging a lower capacitor electrode 71, serving as a pixel-potential-side capacitor electrode, connected to the heavily doped drain region 1e of the TFT 30 and the pixel electrode 9a so as to be opposite to an upper capacitor electrode 300, serving as a fixed-potential-side capacitor electrode, with a dielectric layer 75 interposed therebetween. As shown in FIG. 4, the capacitive element 70 is formed so as to be included in a light shielding region in plan view.

More specifically, the lower capacitor electrode 71 is composed of, for example, a single-layered film made of a metallic material, an alloy thereof, conductive polysilicon, or conductive metal silicide (for example, WSi), or a multilayered film. For example, the lower capacitor electrode 71 is formed of polysilicon into which phosphorus ions are implanted and has a thickness of about 150 nm. In addition to the function of the pixel-potential-side capacitor electrode, the lower capacitor electrode 71 has a function of connecting the pixel electrode 9a to the heavily doped drain region 1e of the TFT 30. The lower capacitor electrode 71 is electrically connected to the pixel electrode 9a by the relay electrode 719.

The dielectric layer 75 is composed of, for example, an insulating film, such as a silicon nitride film or a silicon oxide film including an HTO (high temperature oxide) film or an HDP (high density plasma) film having a thickness of about 5 to 30 nm. For example, the dielectric layer 75 is formed in a two-layer structure having a silicon oxide film, serving as a lower layer, and a silicon nitride film, serving as an upper layer. Alternatively, the dielectric layer 75 may have, for example, a three-layer structure of a silicon oxide film, a silicon nitride film, and a silicon oxide film, it may have laminated structures other than the two-layer structure and the three-layer structure, or it may have at least one metal oxide film, such as $HfO_2$, $Ta_2O_5$, $TiO_2$, or MgO. The dielectric layer 75 may have a multilayered structure.

Further, the capacitor electrode 300 serves as a fixed-potential-side capacitor electrode of the capacitive element 70. In this embodiment, in order to connect the capacitor electrode 300 to a fixed potential, the capacitor electrode 300 is electrically connected to the capacitor line 400 having a fixed potential applied thereto, which will be described later. The capacitor electrode 300 has a function of shielding light incident on the upper side of the TFT 30. The capacitor electrode 300 is composed of, for example, a single-layered film made of a metallic material, an alloy thereof, conductive polysilicon, or conductive metal silicide (for example, WSi), or a multilayered film, similar to the lower electrode 71. In this embodiment, for example, the capacitor electrode 300 is formed of a two-layer structure of a WSi layer, which is an upper layer, and a polysilicon layer, and has a thickness of about 150 nm. In the capacitor electrode 300 having the two-layer structure of the WSi layer and the polysilicon layer, the WSi layer functions to shield light incident on the TFT 30, and the polysilicon layer functions to ensure good electrical conductivity. The WSi layer may be formed of a metallic material, such as aluminum.

As shown in FIG. 5, in this embodiment, the first interlayer insulating film 41, which will be describe below, is provided with a contact hole 81, which will be described below, for electrically connecting the heavily doped source region 1e of the TFT 30 to the lower electrode 71 of the capacitive element 70. In the cross-sectional view shown in FIG. 5, a contact hole 83 is a concave step portion having a side surface between the surface of the first Interlayer insulating film 41, serving as an insulating layer, and the surface of the heavily doped drain region 1e of the TFT 30, which is a lower surface.

A side wall 200 formed of, for example, a plasma TEOS (tetraethyl orthosilicate) film, a low pressure TEOS film, a BPSG (boron phosphor silicate glass), or a metal film is formed in a substantially cylindrical shape on the side surface, which is an inner circumferential surface of the contact hole 83. The upper end of the inner circumferential surface of the side wall 200 comes into contact with the surface of the first interlayer insulating film 41, and the surface of the side wall 200 has a convex curved-surface shape in which the inclination of the side wall 200 with respect to the surface of the TFT array substrate 10 continuously increases as the side wall 200 becomes closer to the upper surface of the heavily doped drain region 1e, which is a lower surface. More specifically, in a cross-sectional view of a plane that is orthogonal to the surface of the first interlayer insulating film 41 and includes a normal line with respect to the side surface of the contact hole 83, a tangent line of the surface of the side wall 200 is substantially parallel to a tangent line of the surface of the first interlayer insulating film 41, at the top of the side wall 200, and the inclination of the tangent line of the surface of the wide wall 200 with respect to the surface of the first interlayer insulating film 411 continuously increases toward the lower side.

That is, the contact hole 83 causes a portion having a horn shape in cross-sectional view to be formed in the upper surface of the first interlayer insulating film 41. However, the side wall 200 formed on the side surface of the contact hole 83 causes a through hole having the surface of the side wall 200 as an inner wall to be formed in the first interlayer insulating film 41 in a tapered shape in which it has the largest inside diameter at the upper end and the smallest inside diameter at the lower end.

In this embodiment, the capacitive element 70 is formed on an area that includes the side wall 200 formed on the side surface of the contact hole 83 and the heavily doped drain region 1e, which is the lower surface of the contact hole 83. Therefore, the capacitive element 70 formed on the surface of the side wall 200 and the first interlayer insulating film 41 has a larger curvature radius in cross-sectional view, as compared with a conventional structure in which the capacitive element 71 is formed on the contact hole 83 without the side wall 200 formed therein and the interlayer insulating film 41.

Therefore, according to this embodiment, in a portion where the side surface of the contact hole 83 intersects the upper surface of the first interlayer insulating film 41 having the capacitive element 70 formed thereon, an electric filed does not concentrate on a part of the lower electrode 71 of the capacitive element 70, and a short circuit between electrodes of the capacitive element 70 does not occur due to breakdown. That is, it is easy to increase the area of electrodes opposite to each other by three-dimensionally forming the capacitive element 70 on a region including the bottom and the side wall of the contact hole 83. In this way, it is possible to stably increase the capacitance of the capacitive element 70 provided in a limited space without the short circuit between the electrodes of the capacitive element 70. For example, in the liquid crystal device, an example of the electro-optical device according to this embodiment, that has driving circuits integrated thereinto and is driven by a TFT active matrix driving method, an increase in the capacitance of the capacitive element 70 makes is possible to improve a flicker level, the display irregularity of pixels, and contrast, thereby improving display quality.

Laminated Structure: Structure between Second Layer and Third Layer—First Interlayer Insulating Film The first interlayer insulating film 41 composed of, for example, a silicate glass film, such as an NSG (non-silicate glass) film, a PSG (phosphor silicate glass) film, a BSG (boron silicate glass) film, or a BPSG (boron phosphor silicate glass) film, a silicon nitride film, or a silicon oxide film is formed on the TFT 30, the gate electrode 3a, and the relay electrode 719 and below the capacitive element 70.

The contact holes 81 each electrically connecting the heavily doped source region 1d of the TFT 30 to the data line 6a, which will be described later, are formed in the first interlayer insulating film 41 and the second interlayer insulating film 42, which will be described later. The contact holes 83, each electrically connecting the heavily doped drain region 1e of the TFT 30 to the lower electrode 71 of the capacitive element 70, are formed in the first interlayer insulating film 41. In addition, contact holes 881, each electrically connecting the relay electrode 719 to the lower electrode 71 serving as a pixel-potential-side capacitor electrode of the capacitive element 70, are formed in the first interlayer insulating film 41. Further, contact holes 882, each electrically connecting the relay electrode 719 to a second relay electrode 6a2, which will be described later, are formed in the first interlayer insulating film 41 and the second interlayer insulating film 42.

Laminated Structure: Structure of Fourth Layer—Data Lines, etc.

The data lines 6a are provided in the fourth layer above the third layer. As shown in FIG. 5, the data line 6a has a three-layer structure of a layer formed of aluminum (see reference numeral 41A in FIG. 5), which is the lowest layer, a layer formed of titanium nitride (see reference numeral 41TN in FIG. 5), and a layer formed of a silicon nitride film (see reference numeral 401 in FIG. 5), which is the uppermost layer. The silicon nitride film is patterned in a size slightly larger than those of the aluminum layer and the titanium nitride so that it covers the aluminum layer and the titanium nitride.

A capacitor line relay layer 6a1 and second relay electrodes 6a2 are formed by the same film as that used for the data lines 6a in the fourth layer. As shown in FIG. 4, the capacitor line relay layer 6a1 and the second relay electrode 6a2 are formed so as not to be connected to the data line 6a in plan view, but so as to be separated from the data line 6a in pattern.

Since the capacitor line relay layer 6a1 and the second relay electrode 6a2 are formed by the same film as that used for the data line 6a, they have a three-layer structure of a layer formed of aluminum, which is the lowest layer, a layer formed of titanium nitride, and a layer formed of a plasma nitride film, which is the uppermost layer.

Laminated Structure: Structure between Third Layer and Fourth Layer—Second Interlayer Insulating Film The second interlayer insulating film 42 composed of a silicate glass film, such as an NSG film, a PSG film, a BSG film, or a BPSG film, a silicon nitride film, or a silicon oxide film is formed on the capacitive elements 70 and below the data lines 6a by, for example, a plasma CVD method using a TEOS gas. The contact holes 81, each electrically connecting the heavily doped source region 1d of the TFT 30 to the data line 6a, and contact holes 801, each electrically connecting the capacitor line relay layer 6a1 to the upper capacitor electrode 300 of the capacitive element 70, are formed in the second interlayer insulating film 42. In addition, the contact holes 882, each electrically connecting the second relay electrode 6a2 to the relay electrode 719, are formed in the second interlayer insulating film 42.

Laminated Structure: Structure of Fifth Layer—Capacitor Lines, etc.

The capacitor lines 400 are formed in the fifth layer above the fourth layer. The capacitor lines 400 are formed in a lattice shape extending in the X and Y directions in plan view, as shown in FIG. 4. In particular, a portion of the capacitor line 400 extending in the Y direction of FIG. 4 is formed to have a larger width than the data line 6a such that it covers the data line 6a. In addition, in order to ensure a region required to form a third relay electrode 402, which will be described later, a cut-out portion is provided in a portion of the capacitor line 400 extending in the X direction of FIG. 4 in the vicinity of the center of one side of each pixel electrode 9a. The capacitor lines 400 extend from the image display region 10a, shown in FIG. 1, having the pixel electrodes 9a arranged therein to the periphery thereof to be electrically connected to a fixed potential source, thereby having a fixed potential.

The third relay electrode 402 is formed in the fourth layer by the same film as that used for the capacitor lines 400. The third relay electrode 402 electrically connects the second relay electrode 6a2 and the pixel electrode 9a through contact holes 804 and 89, which will be described later. The capacitor line 400 and the third relay electrode 402 are formed so as not to be connected to each other in plan view, but so as to be separated from each other in pattern.

The capacitor line 400 and the third relay electrode 402 have a two-layer structure of a lower layer formed of aluminum and an upper layer formed of titanium nitride.

Laminated Structure: Structure between Fourth Layer and Fifth Layer—Third Interlayer Insulating Film The third interlayer insulating film 43 composed of a silicate glass film, such as an NSG film, a PSG film, a BSG film, or a BPSG film, a silicon nitride film, or a silicon oxide film is formed on the data lines 6a and below the capacitor lines 400 by, for example, a plasma CVD method using a TEOS gas. Contact holes 803, each electrically connecting the capacitor line 400 to the capacitor line relay layer 6a1, and the contact holes 804, each electrically connecting the third relay electrode 402 to the second relay electrode 6a2, are formed in the third interlayer insulating film 43.

Laminated Structure: Structure of Sixth Layer and Structure between Fifth Layer and Sixth Layer—Pixel Electrodes, etc.

The pixel electrodes 9a are formed in a matrix in the sixth layer, and the alignment film 16 is formed on the pixel electrodes 9a. The fourth interlayer insulating film 44 composed of, for example, a silicate glass film, such as an NSG film, a PSG film, a BSG film, or a BPSG film, a silicon nitride film, or a silicon oxide film, or preferably, the NSG film is formed below the pixel electrodes 9a. The contact holes 89, each electrically connecting the pixel electrode 9a to the third relay electrode 402, are formed in the fourth interlayer insulating film 44. The pixel electrode 9a and the heavily doped drain region 1e of the TFT 30 are electrically connected to each other through the contact hole 89, the third relay layer 402, the contact hole 804, the second relay layer 6a2, the contact hole 882, the relay electrode 719, the contact hole 881, the lower electrode 71, and the contact hole 83.

As described above, in the electro-optical device according to this embodiment, the capacitive element 70 having high reliability and relatively high capacitance is provided in a limited space. Thus, it is possible to achieve a liquid crystal device capable of displaying a high-quality image.

Method of Manufacturing Electro-Optical Device

Next, a method of manufacturing the electro-optical device according to the above-described embodiment will be described with reference to FIGS. 6A to 6D and FIGS. 7A to 7C. FIGS. 6A to 6D and FIGS. 7A to 7C are enlarged process diagrams illustrating the vicinity of the contact hole 83 shown in FIG. 5 in a laminated structure of the electro-optical device in the method of manufacturing the electro-optical device. In FIGS. 6A to 6D and FIGS. 7A to 7C, the scale of each layer or member is adjusted in order to have a recognizable size. Next, a process of manufacturing the contact hole 83 and the capacitive element 70, which are characteristic members in this embodiment, will be described in detail. A description of processes before the contact hole 83 is formed and after the capacitive element 70 is formed will be omitted.

Figure 6A:
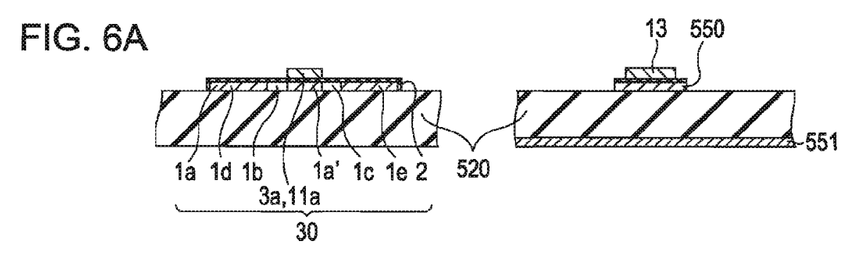
FIGS. 6A to 6D are process diagrams illustrating a method of manufacturing the electro-optical device according to the embodiment of the invention (part 1).

First, as shown in FIG. 6A, the first interlayer insulating film 41 composed of, for example, a silicate glass film, such as an NSG film, a PSG film, a BSG film, or a BPSG film, a silicon nitride film, or a silicon oxide film is formed on the TFTs 30 formed on the TFT array substrate 10 by, for example, an atmospheric pressure or low pressure CVD method using, for example, a TEOS gas, a TEB gas, or a TMOP gas. The first interlayer insulating film 41 is formed with a thickness of about 600 nm.

Figure 6B:
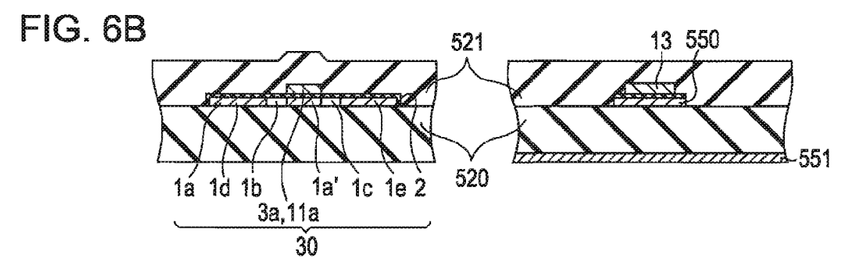

Then, as shown in FIG. 6B, wet etching or dry etching is performed on the first interlayer insulating film 41 to form the contact holes 83. The contact hole 83 is a concave step portion having a side surface between the surface of the first interlayer insulating film 41, serving as an insulating layer, and the upper surface of the heavily doped drain region 1e of the TFT 30, which is a lower surface of the contact hole 83. The contact hole 83 is formed such that the bottom thereof has a diameter of about 1000 nm.

Figure 6C:
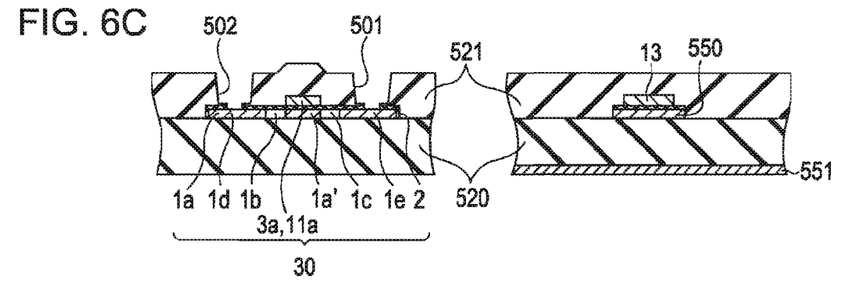

Next, as shown in FIG. 6C, a film 200a to be etched is formed on the entire upper surface of the first interlayer insulating film 41 and the side surface 83b and the lower surface 83a of the contact hole 83 by, for example, a CVD method. The film 200a to be etched is composed of, for example, a plasma TEOS film, a low pressure TEOS film, or a BPSG film. In this case, the film 200a to be etched is set to a thickness of about 220 nm.

Figure 6D:
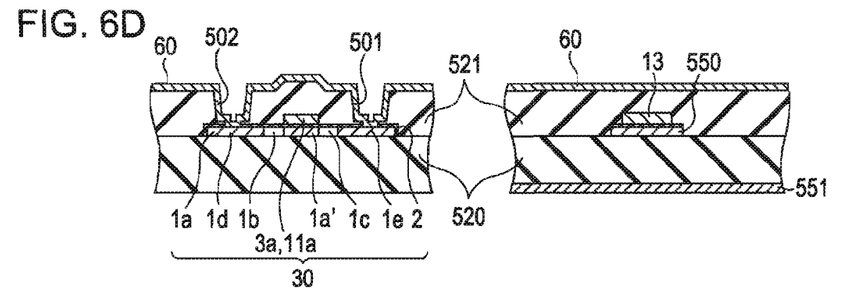

Then, as shown in FIG. 6D, anisotropic etching is performed on the entire surface of the film 200a to be etched such that the film 200a to be etched remains on only the side surface 83b of the contact hole 83 as the side wall 200. The anisotropic etching is dry etching using a mixed gas of $CF_4$ and $CHF_3$ as an etchant. In this case, the inside diameter of the lower surface 83a of the contact hole 83 having the side wall 200 formed on the inner circumferential surface thereof is about 500 nm. The surface of the side wall 200 formed on the side surface 83b of the contact hole 83 has a convex curved-surface shape in which the top thereof comes into contact with an upper surface 41a of the first interlayer insulating film 41 and the inclination of the surface of the side wall 200 with respect to the surface of the first interlayer insulating film 41 continuously increases as it becomes closer to the lower surface 83a. Etching performed on the film 200a in the process shown in FIG. 6D is not limited to the anisotropic etching. For example, isotropic etching may be used as long as it can form the side wall 200 having the above-mentioned surface shape.

Figure 7A:
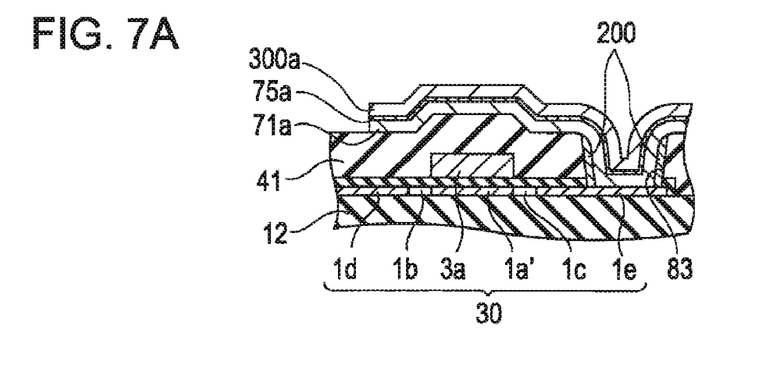
FIGS. 7A to 7C are process diagrams illustrating the method of manufacturing the electro-optical device according to the embodiment of the invention (part 2).

Next, as shown in FIG. 7A, a lower conductive layer 71a, serving as the lower electrode 71 of the capacitive element 70, an intermediate layer 75a, serving as the dielectric layer 75 of the capacitive element 70, and an upper conductive layer 300a, serving as the capacitor electrode 300 of the capacitive element 70, are laminated in this order on the first interlayer insulating film 41 formed on the TFT array substrate 10.

More specifically, a polysilicon film formed on the first interlayer insulating film 41 by, for example, a CVD method, and phosphorus (P) ions are implanted into the polysilicon film to form the lower conductive layer 71a. Alternatively, a doped silicon film formed by implanting phosphorus ions at the same time when a polysilicon film is formed may be used as the lower conductive layer 71a. The lower conductive layer 71a has a thickness of about 150 nm. Then, a single-layered or multi-layered intermediate layer 75a is formed on the lower conductive layer 71a by laminating a silicon oxide film, such as a high temperature oxide film (HTO film) or a high density plasma (HDP film), or a silicon nitride film. The intermediate layer 75a has a thickness in the range of about 20 nm to 30 nm. Subsequently, a polysilicon film is formed on the intermediate layer 75a by, for example, a CVD method, similar to the lower conductive layer 71a, and then phosphorus (P) ions are implanted into the polysilicon film to form the upper conductive layer 300a. Alternatively, a doped silicon film formed by implanting phosphorus ions at the same time when a polysilicon film is formed may be used as the upper conductive layer 300a. The upper conductive layer 300a has a thickness of about 150 nm. Then, as shown in FIG. 7A, the lower conductive layer 71a, the intermediate layer 75a, and the upper conductive layer 300a are sequentially laminated on the upper surface of the first interlayer insulating film 41 and the side wall and the bottom of the contact hole 83.

Figure 7B:
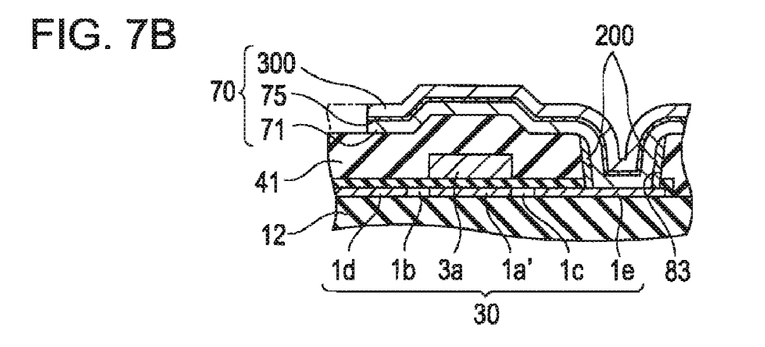

Next, as shown in FIG. 7B, a patterning process photolithography and etching processes) is collectively performed on the upper conductive layer 300a, the intermediate layer 75a, and the lower conductive layer 71a to pattern the capacitor electrode 300, the dielectric layer 75, and the lower electrode 71 at once. The capacitive element 70 is formed by the patterning process.

Figure 7C:
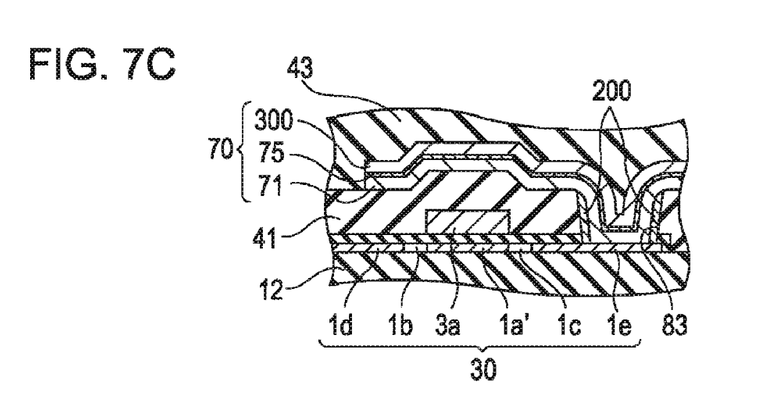

Then, as shown in FIG. 7C, the second interlayer insulating film 43 composed of, for example, a silicate glass film, such as an NSG film, a PSG film, a BSG film, or a BPSG film, a silicon nitride film, or a silicon oxide film is formed on the first interlayer insulating film 41 having the capacitive element 70 formed thereon by, for example, an atmospheric pressure or low pressure CVD method using, for example, a TEOS gas, a TEB gas, or a TMOP gas.

In this way, the contact holes 83 and the capacitive elements 70 of the electro-optical device according to this embodiment are formed by the processes described with reference to FIGS. 6A to 6D and FIGS. 7A to 7C.

According to the manufacturing method of this embodiment, as shown in FIG. 6D, the side wall 200 is formed on the side surface 83b of the contact hole 83 such that a through hole that is formed in the first interlayer insulating film 41 and has the surface of the side wall 200 as an inner wall thereof has the largest diameter at the top and the inside diameter of the through hole gradually decreases toward the bottom. The upper surface 41a of the first interlayer insulating film 41 is continuously connected to the inner surface of the side wall 200 by a curved surface having an upward convex shape. Then, the capacitor electrode 300, the dielectric layer 75, and the lower electrode 71 of the capacitive element 70 formed an area including the surface of the side wall 200 and the upper surface of the first interlayer insulating film 41 have a larger curvature radius, as compared with a conventional structure in which the side wall 200 is not provided. Therefore, according to this embodiment, in a portion where the side surface of the contact hole 83 intersects the upper surface of the first interlayer insulating film 41 having the capacitive element 70 formed thereon, it is possible to obtain the reliability of the thicknesses of the capacitor electrode 300, the dielectric layer 75, and the lower electrode 71 forming the capacitive element 70, as compared with a convention structure in which a film is formed on a horn-shaped portion. That is, it is possible to reduce the thickness of the dielectric layer 75, as compared with the conventional structure. In this way, it is possible to stably increase the capacitance of the capacitive element 70 provided in a limited space. For example, in the liquid crystal device, an example of the electro-optical device according to this embodiment, that has driving circuits integrated thereinto and is driven by a TFT active matrix driving method, an increase in the capacitance of the capacitive element 70 makes it possible to improve a flicker level, the display irregularity of pixels, and contrast, thereby improving display quality.

As described above, according to this embodiment, the capacitive element 70 can be three-dimensionally formed in a limited plane region, which makes it possible to increase the area of the electrode of the capacitive element 70 and to stably form the dielectric layer 75 with a small thickness. Thus, it is possible to obtain an electro-optical device comprising a capacitive element having a high capacitance value and high reliability in which no short circuit occurs between electrodes.

In this embodiment, the side wall 200 is formed of an insulating film, such as a plasma TEOS film, a low pressure TEOS film; or a BPSG film. However, the side wall 200 may be formed of a conductive metal film, such as an aluminum film. When the side wall 200 is formed of a metal film, it is possible to improve the shielding efficiency of the side surface of the contact hole 83 and thus to shield light incident on the semiconductor layer 1a of the TFT 30. In addition, it is possible to prevent the occurrence of an optical leakage current and to display a high-quality image without flicker.

Modifications

Figure 8:
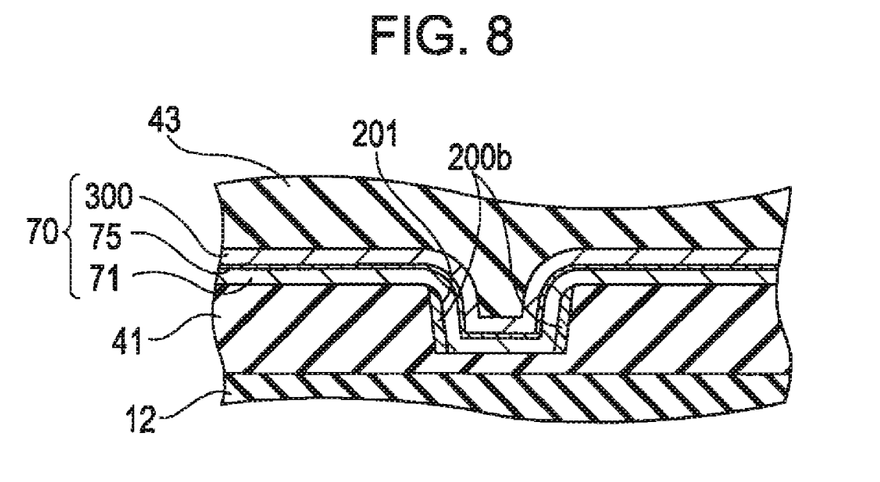
FIG. 8 is a partial enlarged cross-sectional view illustrating an electro-optical device according to a modification of the embodiment of the invention.
Figure 9:
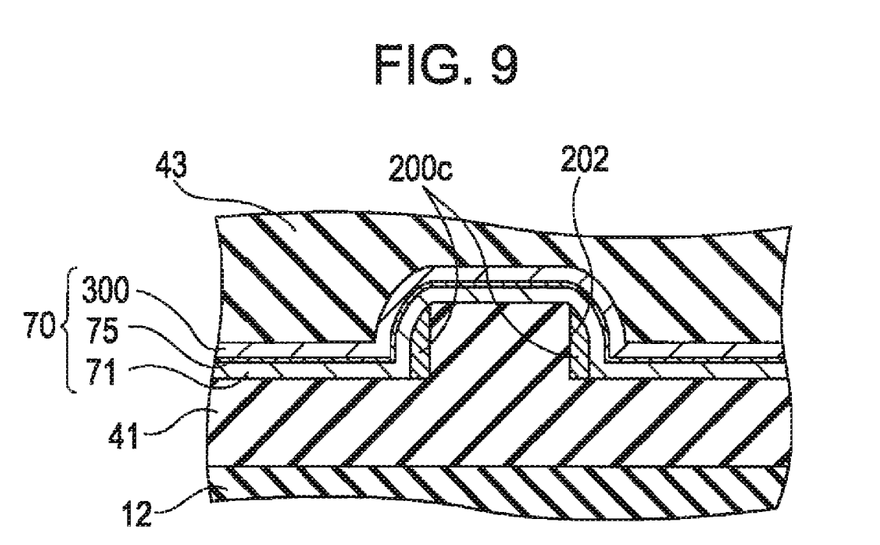
FIG. 9 is a partial enlarged cross-sectional view illustrating an electro-optical device according to another modification of the embodiment of the invention.

In the above-described embodiment, the capacitive element 70 is three-dimensionally formed on the side surface and the lower surface of the contact hole 83, in addition to the upper surface of the first interlayer insulating film 41. However, the invention can be applied to a portion having a concave or convex shape in cross-sectional view that is formed on the first interlayer insulating film 41, which corresponds to a modification of the invention. The modification will be described below with reference to FIGS. 8 and 9. In FIGS. 8 and 9, the scale of each layer or member is adjusted in order to have a recognizable size. In the following modification, the same components as those in the above-described embodiment have the same reference numerals, and thus a description thereof will be omitted.

As shown in FIG. 8, in the modification, a portion of the capacitive element 70 is formed on the side surface and the lower surface of a concave portion 201, which is a concave step portion formed on the first inter-layer insulating film 41. The concave portion 201 is a groove or a hole that is formed in a region in which the capacitive element 70 is formed in plan view. A side wall 200b is formed on the side surface of the concave portion 201 by the same manufacturing method as that used in the above-described embodiment. As shown in FIG. 9, a portion of the capacitive element 70 is formed on the side surface and the upper surface of a convex portion 202, which is a convex step portion formed on the first interlayer insulating film 41. The convex portion 202 is a projection or a wall-shaped member that is formed in a region in which the capacitive element 70 is formed in plan view. A side wall 200c is formed on the side surface of the convex portion 202 by the same manufacturing method as that used in the above-described embodiment. As described in the modification shown in FIGS. 8 and 9, it is possible to increase the capacitance of the capacitive element 70 in the same plane region by providing the concave portion 201 or the convex portion 202 in portions of the first insulating film other than the contact hole 83 and by forming a portion of the capacitive element 70 in the concave portion or on the convex portion.

Electronic Apparatus

Figure 10:
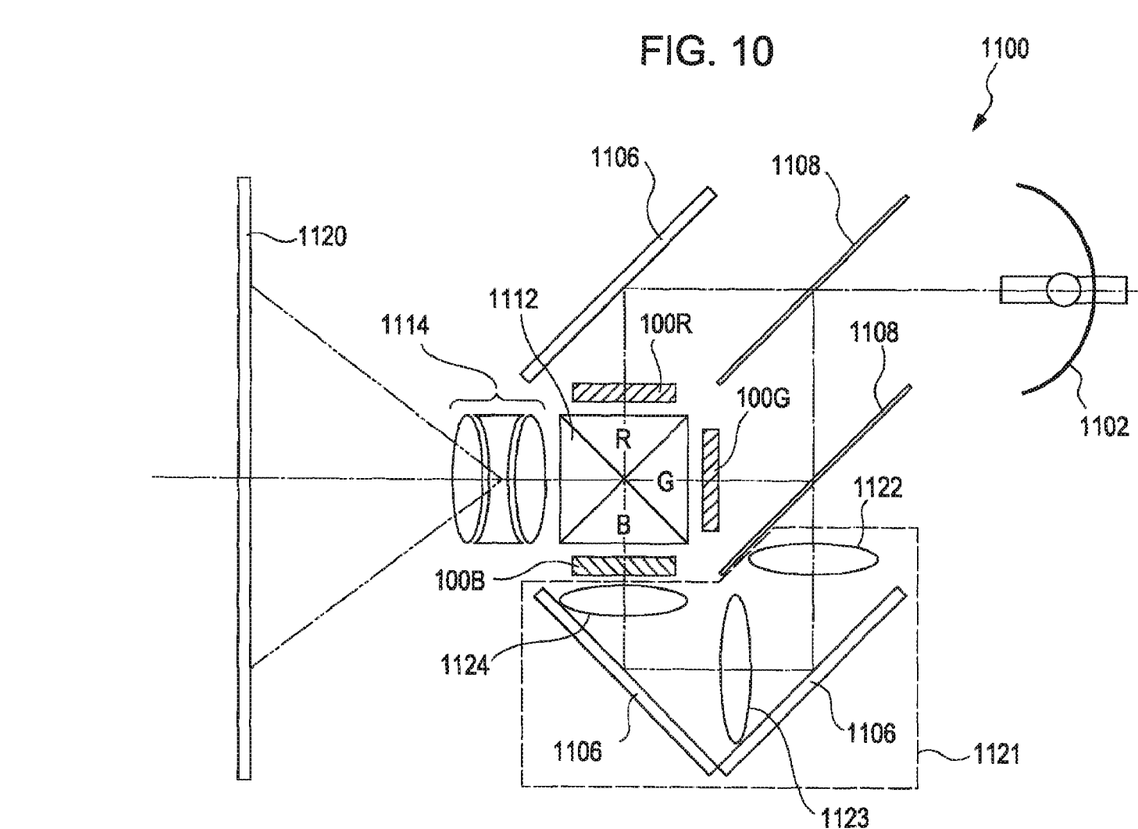
FIG. 10 is a cross-sectional view illustrating the structure of a projector, which is an example of an electronic apparatus to which the electro-optical device is applied.

Next, the overall structure, particularly, the optical structure of a protection-type color display apparatus, which is an example of an electronic apparatus using the liquid crystal devices, which are the above-mentioned electro-optical devices, as light valves will be described with reference to FIG. 10. FIG. 10 is a cross-sectional view illustrating the structure of the protection-type color display apparatus. In FIG. 10, a liquid crystal projector 1100, which is an example of the projection-type color display apparatus according to this embodiment, includes three liquid crystal modules each having a liquid crystal device in which driving circuits are mounted on a TFT array substrate. The three liquid crystal modules are used as R, G, and B light valves 100R, 100G, and 100B. In the liquid crystal projector 1100, projection light emitted from a lamp unit 1102, which is a white light source, such as a metal halide lamp, is separated into light components corresponding to the three primary colors of R, G, and B by three mirrors 1106 and two dichroic mirrors 1108, and the separated light components are guided to the light valves 100R, 100G, and 100B. In this case, the B light component is guided through a relay lens system 1121 including an incident lens 1122, a relay lens 1123, and an emission lens 1124 in order to prevent light loss due to a long optical path. In addition, the light components corresponding to the three primary colors that are modulated by the light valves 100R, 100G, and 100B are combined by a dichroic prism 1112, and are then projected as a color image onto a screen 1120 through a projection lens 1114.

The liquid crystal device, which is an example of the electro-optical device according to the invention, can be applied to various electronic apparatuses, such as a portable computer, a liquid crystal television, a cellular phone, an electronic organizer, a word processor, a view-finder-type or monitor-direct-view-type videotape recorder, a workstation, a video phone, a POS terminal, apparatuses having touch panels, an electrophoresis device, such as an electronic paper, and display devices using electronic emission elements (field emission display and surface-conduction electron-emitter display), in addition to the liquid crystal projector shown in FIG. 10.

The invention can be applied to various electro-optical devices including an electrophoresis device, such as an electronic paper, an electro-luminescent (EL) display device, and display devices using electronic emission elements (field emission display and surface-conduction electron-emitter display), in addition to the liquid crystal device using the active matrix driving method according to the above-described embodiment.

It should be understood that the invention is not limited to the above-described embodiment and modification, but various modifications and changes can be made without departing from the scope and spirit of the invention defined by the appended claims and the entire specification. Therefore, it is to be understood that an electro-optical device, a method of manufacturing the electro-optical device, and an electronic apparatus including the electro-optical device according to the modifications and changes of the invention still fall within the technical scope of the invention.

What is claimed is:

1. An electro-optical device comprising:
   an electro-optical device substrate;
   step portions having a concave shape that are formed on a predetermined insulating film of the electro-optical device substrate;
   side wall portions each of which is formed on a side surface of the concave step portion between the surface of the insulating layer and the bottom of the step portion and has an upward convex curved surface, the surface of the curved surface being continuously formed with the surface of the insulating film at the top of the concave step portion; and
   capacitive elements each of which is formed on the step portion and the side wall portion and has a lower electrode layer, an upper electrode layer, and a dielectric layer interposed between the lower electrode layer and the upper electrode layer.

2. The electro-optical device according to claim 1,
   wherein, in a cross-sectional view of a plane that is orthogonal to the surface of the insulating layer and includes a normal line with respect to the side surface, a tangent line of the surface of the side wall portion is substantially parallel to a tangent line of the surface of the insulating film, at the top of the side wall portion of the concave step portion, and
   the inclination of the tangent line of the surface of the side wall portion with respect to the surface of the insulating film continuously increases toward a lower side.

3. The electro-optical device according to claim 1,
   wherein the concave step portions are contact holes formed in the insulating film.

4. The electro-optical device according to claim 1,
   wherein the side wall portion is composed of a plasma TEOS film, a low pressure TEOS film, or a BPSG film.

5. The electro-optical device according to claim 1,
   wherein the side wall portion is composed of a metal film.

6. An electronic apparatus comprising the electro-optical device according to claim 1.

7. An electro-optical device comprising:
   an electro-optical device substrate;
   step portions having a convex shape that are formed on a predetermined insulating film of the electro-optical device substrate;
   side wall portions each of which is formed on a side surface of the convex step portion between the surface of the insulating layer and an upper surface of the step portion and has an upward convex curved surface, the surface of the curved surface being continuously formed with the upper surface of the convex step portion at the top of the side wall portion; and
   capacitive elements each of which is formed on the step portion and the side wall portion and has a lower electrode layer, an upper electrode layer, and a dielectric layer interposed between the lower electrode layer and the upper electrode layer.

8. The electro-optical device according to claim 7,
   wherein, in a cross-sectional view of a plane that is orthogonal to the surface of the insulating layer and includes a normal line with respect to the side surface, a tangent line of the surface of the side wall portion is substantially parallel to a tangent line of the upper surface of the convex step portion, at the top of the side wall portion, and
   the inclination of the tangent line of the surface of the side wall portion with respect to the surface of the insulating film continuously increases toward a lower side.

9. A method of manufacturing an electro-optical device having capacitive elements formed on a substrate, comprising:
   forming step portions having a concave or convex shape on a predetermined insulating layer;
   forming a film to be etched on a side surface of each of the step portions;
   performing anisotropic etching on the surface of the film to be etched; and
   forming, on a region including the step portion, a portion of the capacitive element having a lower electrode layer, an upper electrode layer, and a dielectric layer interposed between the lower electrode layer and the upper electrode layer.

10. A method of manufacturing an electro-optical device having capacitive elements formed on a substrate, comprising:
    forming step portions having a concave or convex shape on a predetermined insulating layer;
    forming a film to be etched on a side surface of each of the step portions;
    performing etching including isotropic etching and anisotropic etching on the surface of the film to be etched; and
    forming, on a region including the step portion, a portion of the capacitive element having a lower electrode layer, an upper electrode layer, and a dielectric layer interposed between the lower electrode layer and the upper electrode layer.

* * * * *